United States Patent
Kawashima et al.

(10) Patent No.: US 8,129,210 B2
(45) Date of Patent: Mar. 6, 2012

(54) MANUFACTURING METHOD OF MICROSTRUCTURE

(75) Inventors: Takeshi Kawashima, Tokyo (JP); Katsuyuki Hoshino, Tokyo (JP); Shoichi Kawashima, Kawasaki (JP); Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 9 days.

(21) Appl. No.: 12/914,939

(22) Filed: Oct. 28, 2010

(65) Prior Publication Data
US 2011/0039364 A1 Feb. 17, 2011

Related U.S. Application Data

(63) Continuation of application No. PCT/JP2010/004783, filed on Jul. 28, 2010.

(30) Foreign Application Priority Data

Jul. 30, 2009 (JP) .................................. 2009-178401

(51) Int. Cl.
*H01L 21/00* (2006.01)

(52) U.S. Cl. .................. 438/46; 438/478; 257/E21.214; 257/E21.09

(58) Field of Classification Search ............... 438/46, 438/478; 257/95, 98, E21.214, E21.09, E33.023, 257/E33.049
See application file for complete search history.

(56) References Cited

U.S. PATENT DOCUMENTS

| 6,831,302 B2 * | 12/2004 | Erchak et al. ............... 257/87 |
| 7,121,925 B2 * | 10/2006 | Hashimura et al. ........... 451/29 |
| 7,539,226 B2 * | 5/2009 | Uchida ................... 372/43.01 |
| 2007/0280318 A1 | 12/2007 | Yoshimoto et al. |
| 2008/0117941 A1 * | 5/2008 | Nagatomo .................. 372/19 |

FOREIGN PATENT DOCUMENTS

| JP | 2004-111766 A | 4/2004 |
| JP | 2006-191073 | 7/2006 |
| JP | 2006-203196 | 8/2006 |
| JP | 2009-55056 | 3/2009 |
| WO | 2006/062084 A1 | 6/2006 |

* cited by examiner

*Primary Examiner* — Khiem D Nguyen
(74) *Attorney, Agent, or Firm* — Fitzpatrick, Cella, Harper & Scinto

(57) ABSTRACT

A manufacturing method of a microstructure which enables production of a deep and narrow microstructure in a GaN semiconductor with high precision is provided. The manufacturing method of a microstructure for forming a microscopic structure in a semiconductor has a configuration having a first step of forming a first GaN semiconductor layer on a substrate, a second step of forming a first hole by using etching on the first GaN semiconductor layer formed in the first narrow, and a third step of performing heat-treatment at a temperature from 850° C. to 950° C. inclusive under a gas atmosphere including nitrogen, in order to form a second narrow in which a diameter of the first hole h formed in the second step is made narrower than the diameter of the first hole in an in-plane direction of the substrate.

10 Claims, 13 Drawing Sheets

MANUFACTURING METHOD OF MICROSTRUCTURE

CROSS-REFERENCE TO RELATED APPLICATIONS

This application is a continuation of International Application No. PCT/JP2010/004783, filed Jul. 28, 2010, which claims the benefit of Japanese Patent Application No. 2009-178401, filed Jul. 30, 2009.

BACKGROUND OF THE INVENTION

1. Field of the Invention

The present invention relates to a manufacturing method of a microstructure, particularly relates to a manufacturing method for forming a microscopic structure inside a semiconductor, and relates to an art for use in a method for manufacturing a light emitting device using a photonic crystal.

2. Description of the Related Art

In recent years, a surface-emitting laser using a two-dimensional photonic crystal has been developed. A photonic crystal has the structure in which a refractive index profile is provided in a wavelength size of light, and a photonic crystal which acts on visible light is in a size of several tens nm to several hundreds nm. Such a two-dimensional photonic crystal is produced by burying a material such as a dielectric into a semiconductor or forming voids by etching.

International Publication WO 06/062084 Pamphlet discloses the art of producing a two-dimensional photonic crystal inside a GaN semiconductor by crystal growth. In concrete, a two-dimensional photonic crystal is produced as follows. First, a multilayer film structure of a semiconductor is formed part way on a substrate. Next, the substrate on which the multilayer film structure of the semiconductor is taken out of a reactor, and a pattern of the photonic crystal is formed on the surface of the multilayer film structure by electron beam lithography. Thereafter, a hole of the two-dimensional photonic crystal is formed in the semiconductor multilayer film structure by using dry etching. Finally, a remaining multilayer structure is stacked while the hole of the two-dimensional photonic crystal is kept by regrowth, and a light emitting device is completed.

SUMMARY OF THE INVENTION

In the optical device including a two-dimensional photonic crystal, a deep hole needs to be formed in order to increase the diffraction effect of light. In order to form the hole, RIE (Reactive Ion Etching) is used. However, a GaN semiconductor is a hard material, and therefore, formation of microscopic holes by etching is difficult. For example, if a hole is formed by dry etching such as RIE described above, the hole tends to be in a taper shape with a wide hole upper portion. Further, if deep etching is performed, the hole upper portion becomes wider proportionally to the depth, and the hole cannot be formed with high precision.

Thus, an object of the present invention is to provide a manufacturing method of a microstructure, which enables production of a microstructure in a GaN semiconductor with high precision.

The present invention provides a manufacturing method of a microstructure configured as follows. The manufacturing method of a microstructure for forming a microscopic structure in a semiconductor of the present invention has a first step of forming a first GaN semiconductor layer on a substrate, a second step of forming a first hole by using etching on the first GaN semiconductor layer formed in the first step, and a third step of performing heat-treatment at a temperature from 850° C. to 950° C. inclusive under a gas atmosphere including nitrogen, in order to form a second hole in which a diameter of the first hole formed in the second step is made narrower than the diameter of the first hole in an in-plane direction of the substrate.

According to the present invention, the manufacturing method of a microstructure can be provided, which enables production of a microstructure in a GaN semiconductor with high precision.

Further features of the present invention will become apparent from the following description of exemplary embodiments with reference to the attached drawings.

BRIEF DESCRIPTION OF THE DRAWINGS

FIG. 1A illustrates a first step.

FIG. 1B illustrates a second step.

FIG. 1C illustrates a third step.

FIG. 7A is in the case of hole depths of about 240 nm and 340 nm.

FIG. 7B is in the case of hole depths of about 240 nm and 340 nm.

FIG. 8A is the result of the case of the heat-treatment temperatures of 900° C., 950° C. and 1025° C.

FIG. 8B is the result of the case of the heat-treatment temperatures of 900° C., 950° C. and 1025° C.

FIG. 8C is the result of the case of the heat-treatment temperatures of 900° C., 950° C. and 1025° C.

FIG. 9A is the shape when the heat-treatment was carried out at a heat-treatment temperature of 850° C.

FIG. 9B is the shape of the hole when the heat-treatment was carried out at a heat-treatment temperature of 800° C.

DESCRIPTION OF THE EMBODIMENTS

Preferred embodiments of the present invention will now be described in detail in accordance with the accompanying drawings.

A manufacturing method of a microstructure in embodiments of the present invention will be described.

[Embodiment 1]

Figure 1A:
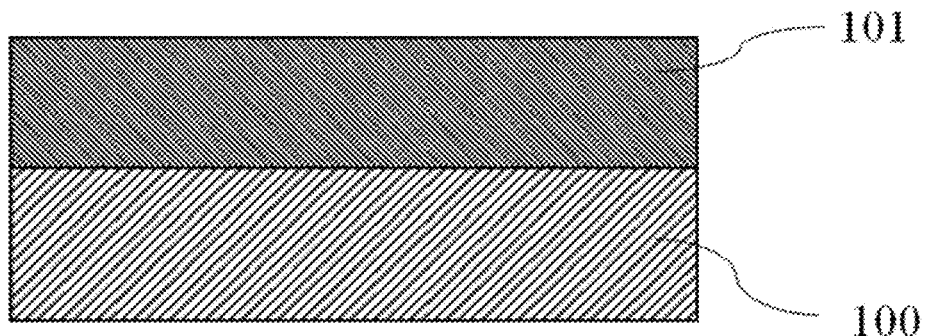
FIG. 1A is a process chart of a manufacturing method of a microstructure in embodiment 1 of the present invention.
Figure 1B:
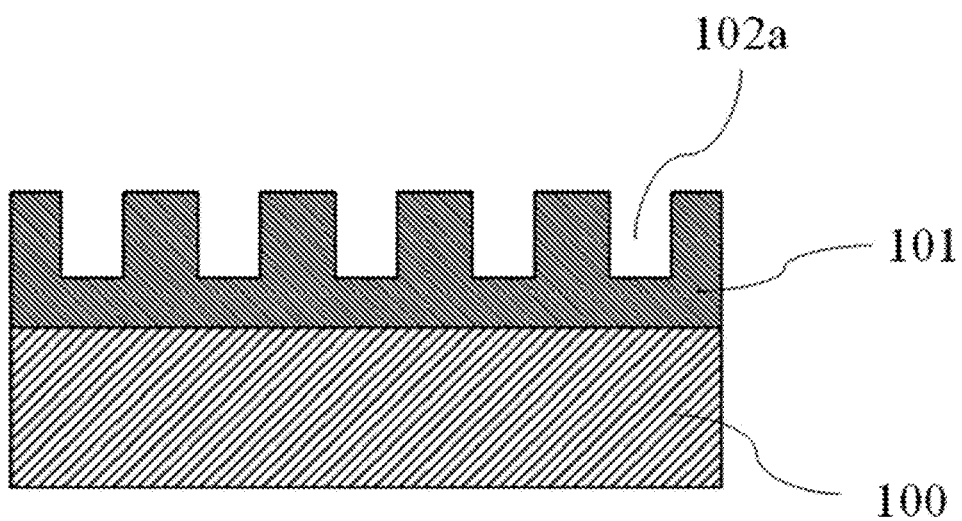
FIG. 1B is a process chart of the manufacturing method of a microstructure in embodiment 1 of the present invention.
Figure 1C:
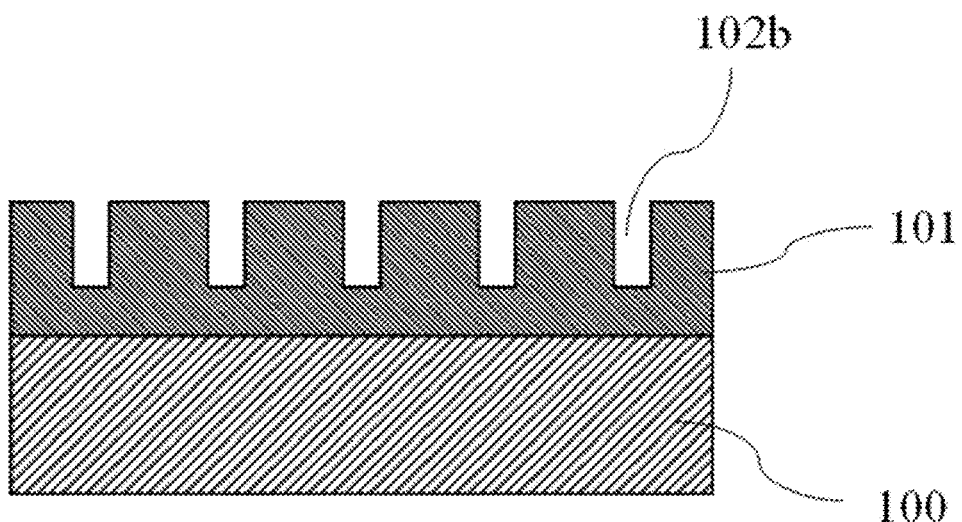
FIG. 1C is a process chart of the manufacturing method of a microstructure in embodiment 1 of the present invention.

By using FIGS. 1A to 1C, a manufacturing method of a microstructure of a nitride semiconductor in embodiment 1 to which the present invention is applied will be described.

(First Step)

First of all, in a first step, a first GaN semiconductor layer is formed on a substrate. In more concrete, as shown in FIG. 1A, a first GaN semiconductor layer 101 is stacked on a substrate 100 by an MOCVD method (Metalorganic Chemical Vapor Deposition), an HVPE method (Hydride Vapor Phase Epitaxy) and an MBE method (Molecular Beam Epitaxy). The substrate 100 used here may be of any material if only a GaN semiconductor can grow thereon, and for example, a substrate of sapphire, SiC, Si, GaAs, or GaN is used. Further, for the above described first GaN semiconductor 101, GaN, InN, AlN, AlGaN, InGaN, AlInN or AlGaInN is used.

(Second Step)

Next, in a second step, a first hole 102a is formed in the above described first GaN semiconductor layer 101 by using etching. For this purpose, a mask for etching is formed on the first GaN semiconductor layer 101. The pattern of the mask has a plurality of holes at constant spaces, and as the hole pattern shape, a circle, a triangle, a quadrangle and a polygon are used. In the present embodiment, the case of use of $SiO_2$ as the mask will be described, but the kind of the mask is not limited to this. Any mask can be used, that can be easily processed, and can be removed by a method against which the GaN semiconductor has resistance. For example, a photoresist which can be removed with a developing solution, a dielectric such as $SiO_2$ which can be removed by hydrofluoric acid, and a metal such as Ni which can be removed with aqua regia can be cited. In concrete, etching is performed in the following procedures. First, $SiO_2$ is formed on the first GaN semiconductor layer 101. Next, a photoresist is coated, and the pattern is formed on the photoresist by photolithography or electron beam lithography. Next, $SiO_2$ is etched by RIE (Reactive Ion Etching) using $CF_4$ gas. Thereafter, the photoresist is removed, and with use of $SiO_2$ as a semiconductor etching mask, the first GaN semiconductor layer 101 is etched by RIE using $Cl_2$. Finally, $SiO_2$ is removed by hydrofluoric acid, and thereby, the first hole 102a of FIG. 1B is formed in the surface of the first GaN semiconductor layer 101. For etching, ICP (Inductively Coupled Plasma etching) and FIB (Focused Ion Beam etching) can be used as well as RIE.

(Third Step)

(Temperature of Heat-treatment in Third Step)

Next, in a third step, heat-treatment is performed for forming a second hole 102b in which the diameter of the first hole 102a produced by the above described etching is made smaller in an in-plane direction of the above described substrate than the diameter of the first hole 102a. In concrete, heat-treatment is performed at a temperature lower than an epitaxial growth temperature under a gas atmosphere including nitrogen. Here, the epitaxial growth temperature is the growth temperature for growing a semiconductor crystal with favorable crystallinity, and is 1000° C. to 1200° C. for GaN, for example. Accordingly, the temperature range in the heat treatment of the third step can be 950° C. or lower, and can be 900° C. or lower. Meanwhile, if the heat-treatment temperature is too low, the phenomenon called mass-transport used in the present invention does not occur, and therefore, the heat-treatment temperature can be 850° C. or higher. The heat-treatment temperature, and heat-treatment time of the heat-treatment for making the hole 102a of the third step in the present invention narrower will be described in experimental examples 1, 2 and 3 which will be described later. Next, the procedures of the heat-treatment and the phenomenon (mass-transport) which occurs to the heat-treatment will be described. First, a wafer is set in a heating furnace, gas to be a nitrogen source is supplied, and the substrate is raised in temperature to 850° C. to 950° C. In this step, the atomic bond is cut on the surface of the first GaN semiconductor layer 101, and atoms flow into the first hole 102a. The phenomenon where atoms move by the heat-treatment is called mass-transport. Atoms flow into the hole 102a by mass-transport, and thereby, the diameter of the first hole 102a becomes small. As a result, as shown in FIG. 1C, the second hole 102b which is narrower than the first hole 102a is formed.

The advantages by mass-transport are as follows besides formation of the second hole 102b narrower than the first hole 102a. When the atoms are transported to the first hole 102a by mass-transport and are reattached onto the side wall, the atoms are recrystallized and attached thereto. Therefore, the damage by the etching in the second step can be recovered.

Further, the etching damage is recovered and removed, and therefore, even if another semiconductor layer is grown thereon, the disadvantage of degrading crystallinity can be eliminated.

(Gas Atmosphere in Third Step)

Next, the details of the gas atmosphere including a nitrogen source in the heat-treatment of the above described third step will be described. The gas atmosphere in the heat-treatment of the third step includes a nitrogen source so as to suppress desorption of nitrogen from the first GaN semiconductor. As the nitrogen source, $NH_3$ (ammonia) and dimethyl hydrazine are used. Further, during heat treatment, a group III raw material of Ga, Al and In may be supplied apart from the gas of the nitrogen source. The first hole 102a is not filled if the supply amount of the group III raw material is such that a III/N ratio during heat-treatment in the third step is lower than the molar ratio (III/N ratio) of the group III source and the nitrogen source at the time of stack of the first GaN semiconductor layer 101 in the first step. The III/N ratio during heat-treatment of the third step can be 1/2, and 1/10 of the III/N ratio of the first step. The diameter and the depth of the first hole 102a is formed to be larger than designed by about 10% or 20%, whereby the diameter and the depth of the second hole 102b can be controlled by the time of the heat-treatment, the heat-treatment temperature and the supply amount of the group III raw material in the third step.

(Low Temperature Mass-transport)

Next, the details of the above described mass-transport will be described. As described above, the present invention enables production of a narrow and deep structure by controlling the phenomenon called mass-transport. The concrete difference between the mass-transport of the present invention and ordinary mass-transport will be described hereinafter by using FIGS. 4A to 5B. FIGS. 4A to 5B illustrate a substrate 400, a semiconductor 401, a hole 402a, a cavity 402b, a hole 402c which is narrower than 402a, and an atom 403.

Figure 4A:
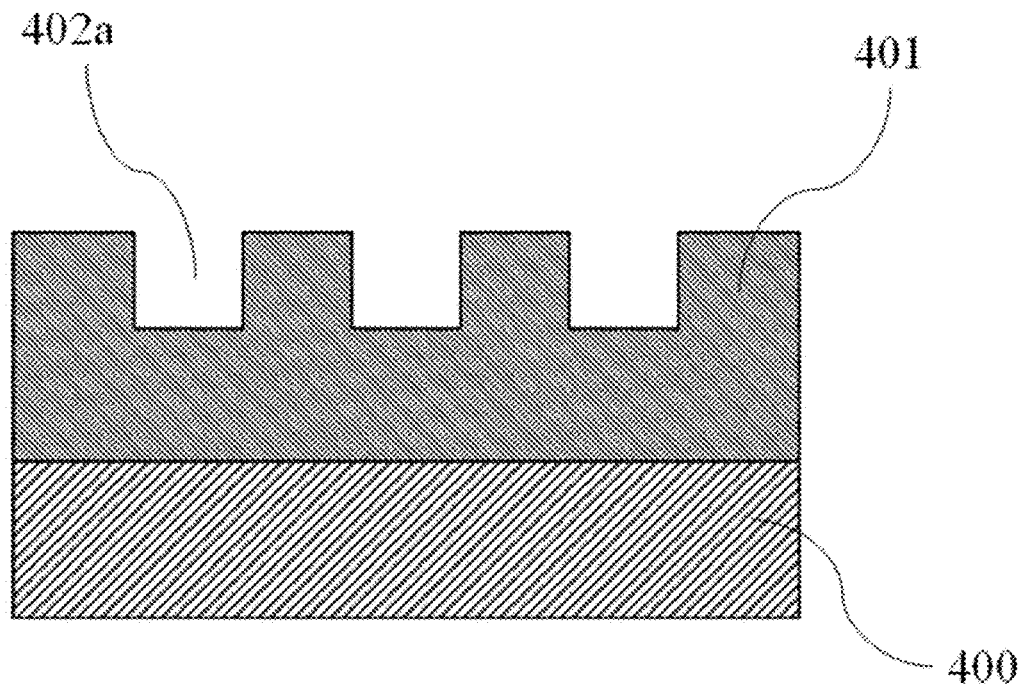
FIG. 4A is a schematic view illustrating a process of mass-transport.
Figure 4B:
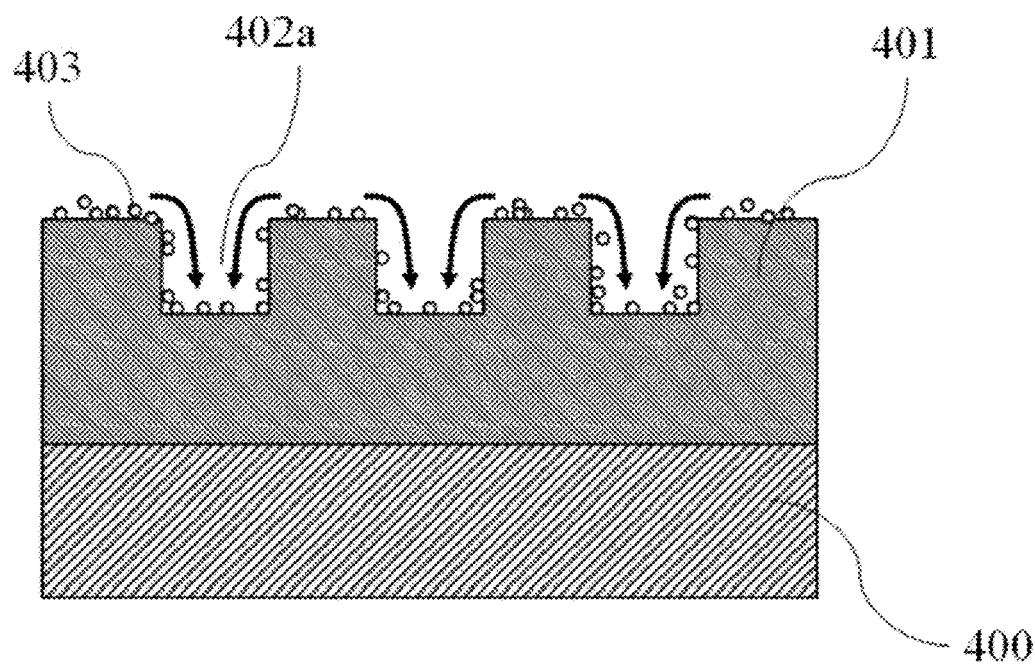
FIG. 4B is a schematic view illustrating a process of the mass-transport.
Figure 4C:
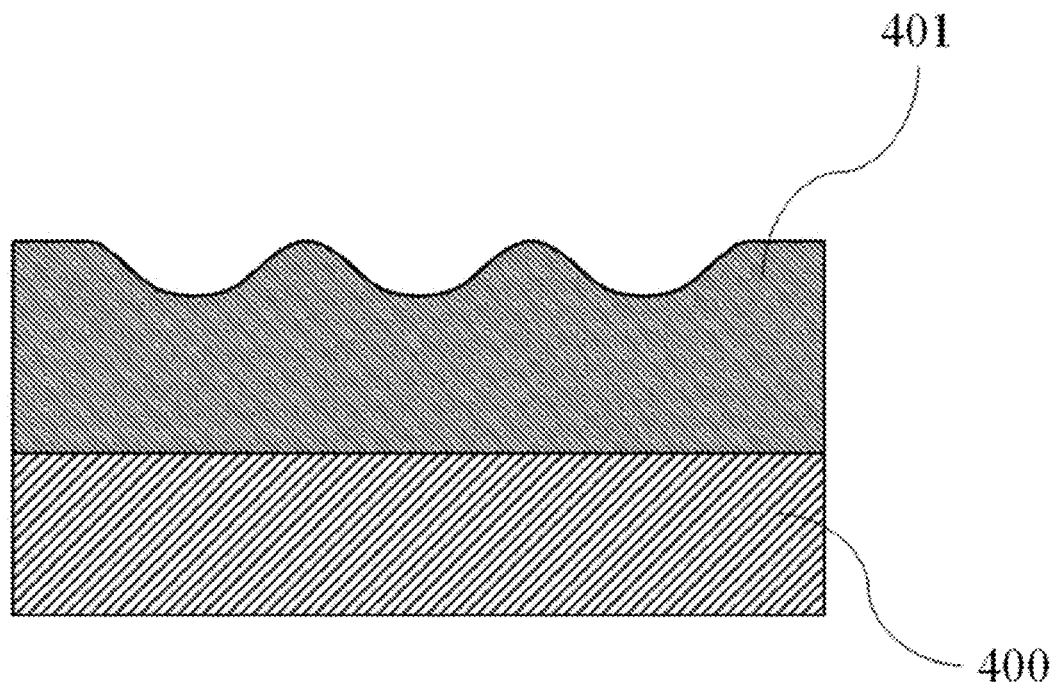
FIG. 4C is a schematic view illustrating a process of the mass-transport.
Figure 4D:
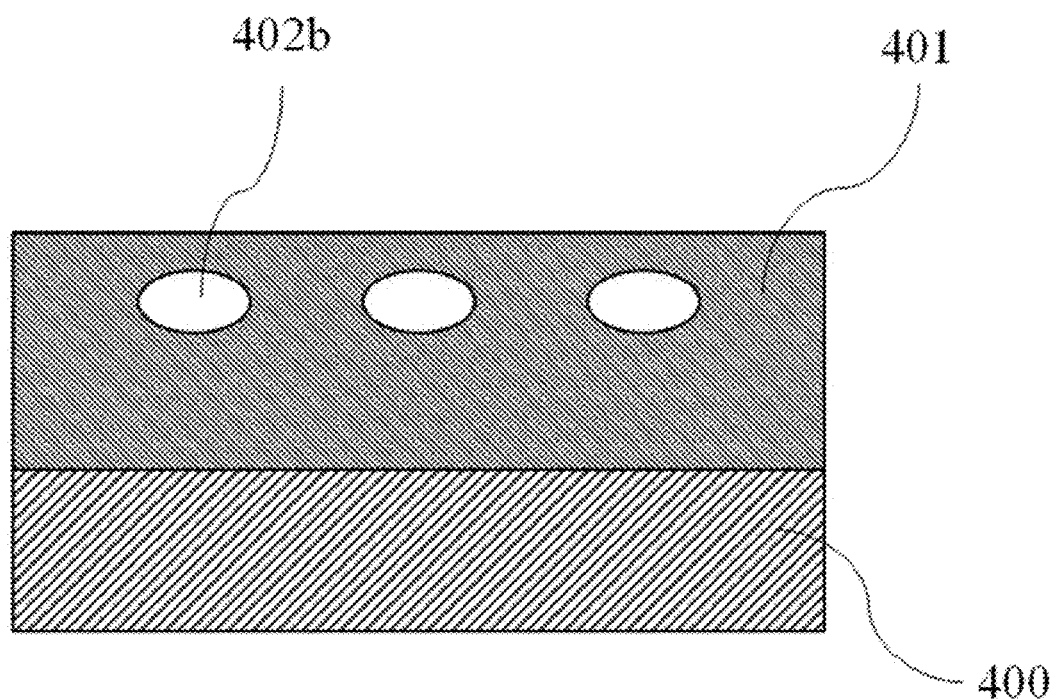
FIG. 4D is a schematic view illustrating a process of the mass-transport.

In ordinary mass-transport, a substrate is heated to an epitaxial growth temperature, and sufficient thermal energy is given, whereby atoms on the substrate surface are diffused and transported, and are reattached to the surface when the surface energy becomes small. In concrete, as in FIG. 4A, the semiconductor 401 is stacked on the substrate 400, and the hole 402a is formed. When the substrate 400 is heated to an epitaxial growth temperature, the bond of the atoms 403 on the substrate surface is cut by the thermal energy as in FIG. 4B, and the atoms 403 diffuse on the surface of the semiconductor 401. Subsequently, the atoms 403 flow in a direction in which the surface energy becomes low, that is, to an inside of the hole 402a from the substrate surface. After heat-treatment, as shown in FIG. 4C, the hole 402a is filled by the semiconductor 401 itself, and a smooth surface is formed. Meanwhile, when the aspect ratio of the hole 402a is high, the upper portion of the hole 402a is closed and the cavity 402b is formed as in FIG. 4D.

Figure 5A:
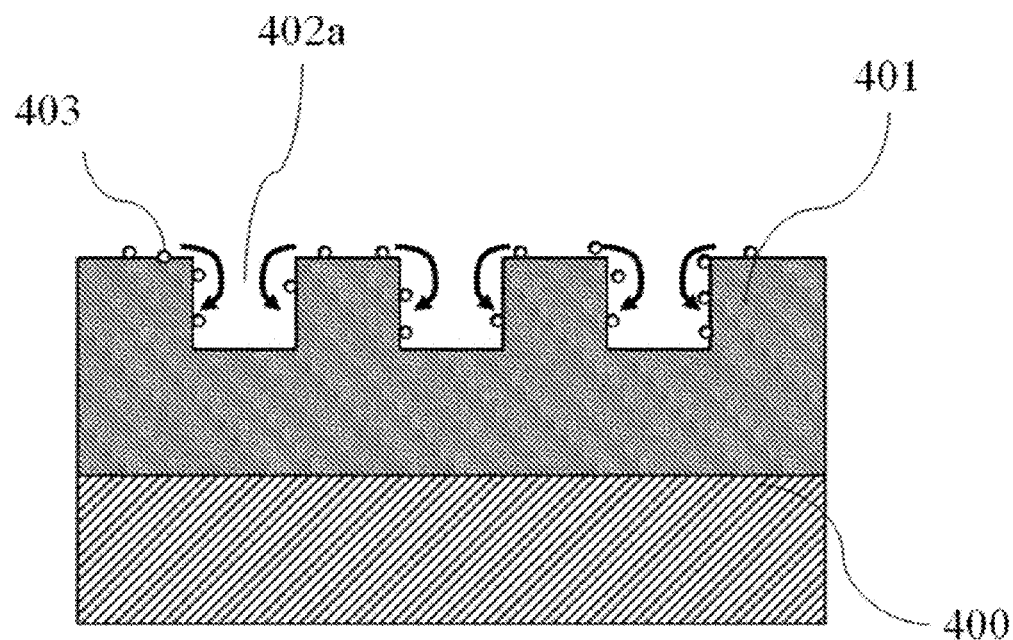
FIG. 5A is a schematic view illustrating a process of mass-transport according to the present invention.
Figure 5B:
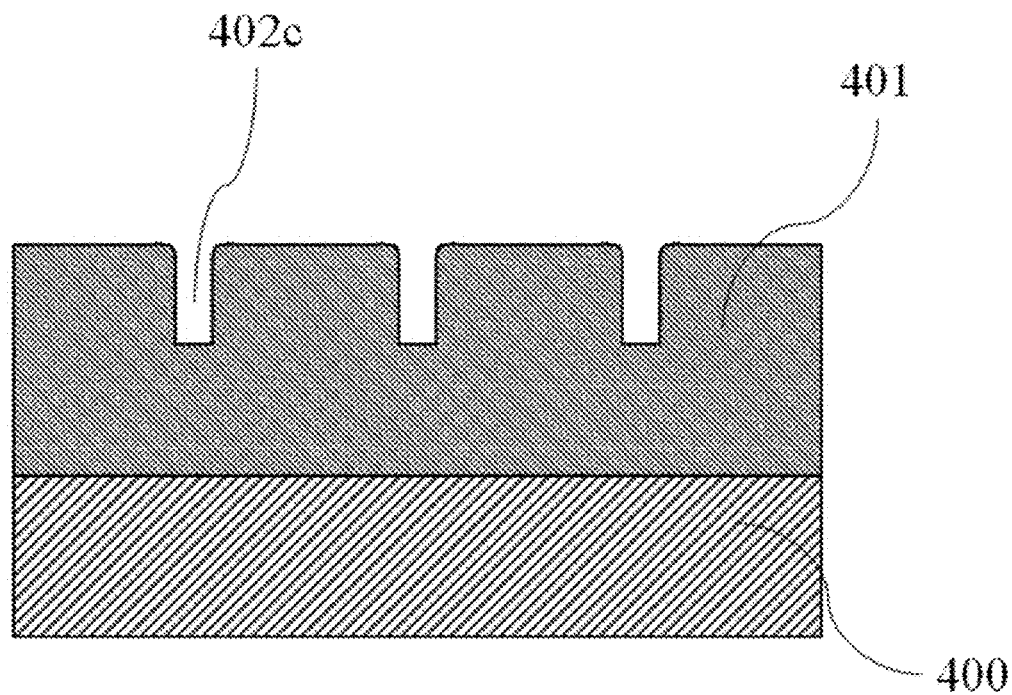
FIG. 5B is a schematic view illustrating a process of the mass-transport according to the present invention.

In contrast with the above described ordinary mass-transport, in the mass-transport according to the present invention, the diffusion length of atoms, and the amount of diffusing atoms are controlled. In concrete, by performing heat-treatment at an arbitrary temperature lower than the epitaxial growth temperature, the diffusion length of the atoms is shortened, and the amount of the atoms 403 diffusing to the hole 402a from the surface of the semiconductor 401 is decreased as illustrated in FIG. 5A. In the description of the present application, such mass-transport is called "low temperature mass-transport". In the low temperature mass-transport, the process of transport and reattachment of the atoms 403 differs from that of the ordinary mass-transport, and the diffusion length of the atoms is short. Therefore, the atoms 403 reattaches on the side wall of the hole 402a. As a result, as illustrated in FIG. 5B, the hole 402a becomes narrow, and the narrow hole 402c is formed. Further, since the atoms 403 reattach onto the side wall of the hole 402a, the atoms 403 hardly reach the bottom of the hole 402a, and the change amount of the depth of the hole 402a can be made small.

The aspect ratio at the time of the low temperature mass-transport of the present invention described above will be described. When the aspect ratio of the first hole 102a is less than one, a facet plane oblique to the principal plane of the substrate 100 is easily formed during heat-treatment, so that the first hole 102a sometimes becomes shallow, and the first hole 102a is sometimes filled. For example, in the case of the GaN semiconductor of a (0001)c plane, the facet plane shown as follows and an oblique facet plane with a higher index than this surface are easily formed.

$$\{1\bar{1}01\}, \{11\bar{2}2\}$$

Therefore, the aspect ratio of the first hole 102a is desired to be one or more, and can be two or more. Further, with respect to the hole diameter at the time of the low temperature mass-transport, the effect of the present invention is remarkably exhibited when the structure with the hole diameter of the first hole 102a of 1 μm or less is subjected to the heat-treatment. In concrete, the hole diameter can be made 500 nm or less, and can be made 250 nm or less. This is because, in the low temperature mass-transport, heat-treatment is performed at a temperature lower than epitaxial growth temperature, and therefore, the diffusion length of the atoms is short, and the velocity at which the hole becomes narrow is low, and several nm/min or less.

[Embodiment 2]

Figure 2:
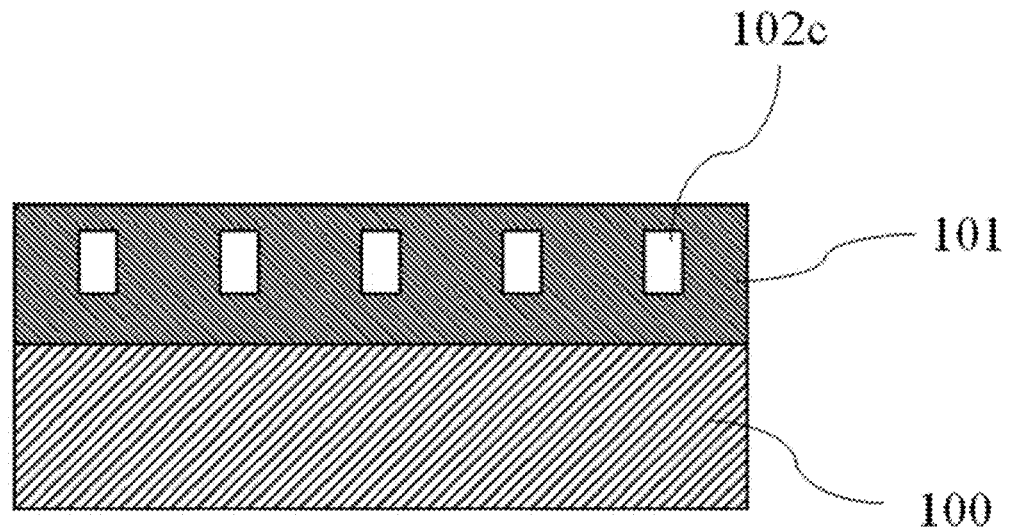
FIG. 2 is a sectional view schematically illustrating a microstructure in embodiment 2 of the present invention.

As embodiment 2, the mode of closing the second hole 102b by heat-treatment after the third step will be described by using FIG. 2. The present embodiment is the same as embodiment 1 up to the third step of making the first hole 102a narrow according to the heat-treatment of embodiment 1 to form the second hole 102b, and therefore, the description up to the third step will be described. In the present embodiment, as a fourth step, heat-treatment is performed in the gas atmosphere including nitrogen. In concrete, after the first hole 102a is made narrow and the second hole 102b is formed in the heat-treatment of the third step, heat-treatment is performed at a temperature higher than the temperature of the heat-treatment in the second step in the gas atmosphere including nitrogen. The gas atmosphere in the heat-treatment of the fourth step includes a nitrogen source in order to suppress desorption of nitrogen from the first GaN semiconductor in the heat-treatment of the third step. As the nitrogen source, $NH_3$ and dimethylhydrazine are used. The heat-treatment temperature in the fourth step in the present embodiment is set at the epitaxial growth temperature or higher. In concrete, the heat treatment temperature is 1000° C. or higher, and can be 1025° C. or higher.

In this step, ordinary mass-transport occurs. As compared with the third step in which the heat-treatment temperature is 900° C. or lower, the diffusion length of atoms is large in the heat-treatment at 1000° C. or higher. The second hole 102b is of a narrow and deep structure with a high aspect ratio by the heat-treatment of the third step, and therefore, atoms hardly reach the bottom of the second hole 102b, and reattaches onto the upper portion. As a result, the upper portion of the second hole 102b is closed by the first GaN semiconductor layer 101, and the third hole 102c is formed inside the first GaN semiconductor layer 101. The heat-treatment of the third step and the heat-treatment of the fourth step may be carried out in the same heating furnace, and in this case, the substrate does not have to be exposed to the air atmosphere. Therefore, when the upper portion of the second hole 102b is closed with the first GaN semiconductor layer 101 in the heat-treatment of the fourth step, inclusion of an impurity such as oxygen can be prevented.

[Embodiment 3]

Figure 3:
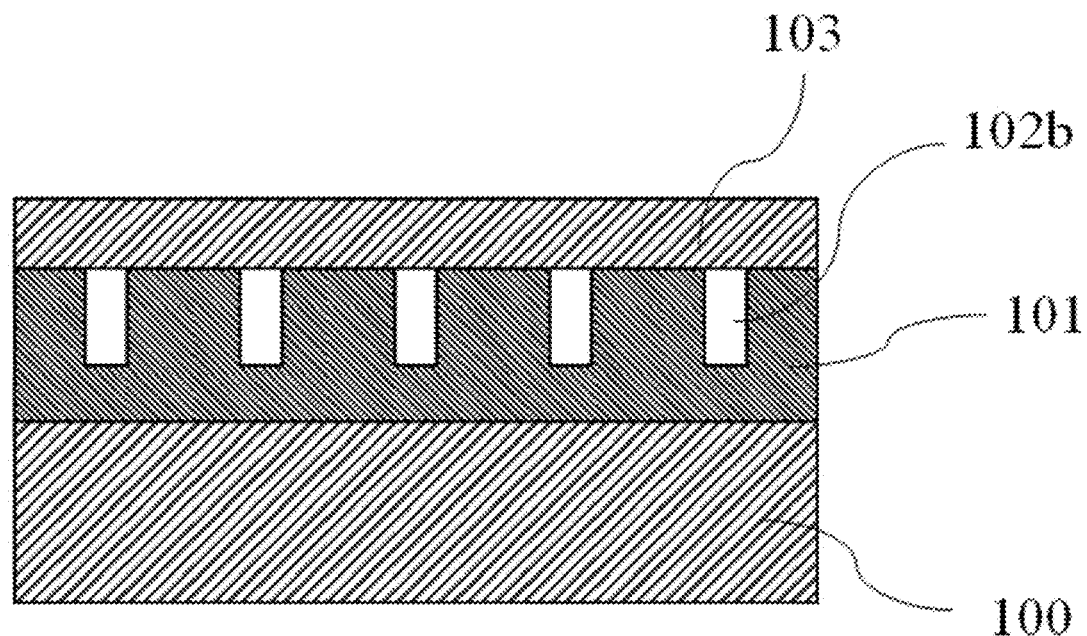
FIG. 3 is a sectional view schematically illustrating a microstructure in embodiment 3 of the present invention.

As embodiment 3, the mode of closing the second hole 102b with crystal growth after the third step will be described with use of FIG. 3. The present embodiment is the same as the embodiment 1 up to the third step of making the first hole 102a narrow to be formed into the second hole 102b of embodiment 1, and therefore, the description up to the third step will be omitted. In the present embodiment, after the first hole 102a is formed into the second hole 102b by the heat-treatment of the third step, the nitrogen raw material and the group III raw material are supplied as the fourth step. The second hole 102b has the structure narrow and depth with a high aspect ratio, and therefore, the group III raw material hardly reaches the bottom of the second hole 102b. As a result, the shape of the second hole 102b does not change significantly, and a second GaN semiconductor layer 103 can be formed on the first GaN semiconductor layer 101. The growth temperature of the second GaN semiconductor layer 103 can be the temperature at which the crystallinity of the second GaN semiconductor layer 103 does not degrade, or the temperature at which the second GaN semiconductor layer 103 does not become polycrystal. However, when the growth temperature is lower than the epitaxial growth temperature, the raw material does not sufficiently diffuse on the substrate. Therefore, a part of the raw material flows into the inside of the second hole 102b, and the depth of the second hole 102b decreases. Therefore, the growth temperature of the second GaN semiconductor layer 103 can be 1000° C. or higher, and can be 1025° C. or higher. The heat-treatment of the third step and the heat-treatment of the fourth step may be carried out in the same heating furnace. In this case, the substrate does not have to be exposed to the air atmosphere, and therefore, when the second GaN semiconductor layer 103 is formed in the heat-treatment of the fourth step, inclusion of an impurity such as oxygen can be prevented. In the heat-treatment of the third step, etching damage of the first hole 102a is removed, and therefore, the second GaN semiconductor layer can be formed without degrading the crystallinity.

EXAMPLES

In the present examples, examples will be described, in which the heat-treatment of the third step is performed at 900° C., and low temperature mass-transport is generated, whereby the hole is formed, as examples of the above described embodiments.

Example 1

In the present example, a method for producing a microstructure by using the manufacturing method shown in embodiment 1 will be described. First, as the substrate 100, a sapphire substrate of a c plane is used. Next, the sapphire substrate is set in an MOCVD apparatus. The sapphire substrate is heated to about 1100° C., and the sapphire substrate surface is cleaned in a hydrogen atmosphere. Thereafter, the substrate temperature is lowered to about 500° C., TMG (trimethyl gallium) is supplied at 100 μmol/min, and 5 slm of $NH_3$ is supplied, whereby a low temperature GaN buffer layer of a thickness of 20 nm is formed. Next, the substrate is heated to 1100° C., and GaN is grown by 3 μm as the GaN semiconductor layer 101. Next, the substrate is taken out of the MOCVD apparatus, $SiO_2$ of a thickness of 200 nm is formed on GaN by a sputtering method, and a resist is coated on $SiO_2$. Next, by using electron beam lithography, a circular square-lattice pattern is drawn and developed. The diameter of the circle is 100 nm, and the distance between the centers of the adjacent circles is 200 nm.

Next, with the resist used as a mask, $SiO_2$ is etched by RIE by using $CF_4$ gas.

A tetragonal lattice pattern is formed on the $SiO_2$, and therefore, with the $SiO_2$ used as a mask, the GaN is etched. The GaN is etched by RIE using $Cl_2$ gas, and a hole with a depth of 250 nm is formed as the first hole 102a. The $SiO_2$ is removed with hydrofluoric acid, and the substrate is set in the MOCVD apparatus again. The substrate is heated to 900° C. while 10 slm of $N_2$ and 5 slm of $NH_3$ are supplied. When the substrate temperature reaches 900° C., the temperature is kept at 900° C., and heat-treatment is performed for 30 minutes. In this step, in GaN, GaN decomposition, transport of Ga and reattachment of Ga and N occur by low temperature mass-transport. The low temperature mass-transport is performed at a temperature (900° C.) lower than the epitaxial growth temperature, Ga transported from the surface of GaN reattaches to the side wall of the hole, and the hole diameter becomes small. As a result of the heat-treatment at 900° C., the hole has a diameter of 50 nm, and a depth of 230 nm which is shallower by 20 nm, so that a deep and narrow hole is formed.

Example 2

In the present example, a method for producing a microstructure by using the manufacturing method shown in embodiment 2 will be described. First, as the substrate 100, a GaN substrate of a c plane is used. Next, the GaN substrate is set in the MOCVD apparatus. The GaN substrate is heated to about 1100° C., TMG (trimethyl gallium) is supplied at 100 μmol/min, and 5 slm of $NH_3$ is supplied, whereby GaN is grown by 3 μm as the GaN semiconductor layer 101. Next, the substrate is taken out of the MOCVD apparatus, $SiO_2$ of a thickness of 300 nm is formed on GaN by a plasma CVD apparatus, and a resist is coated on $SiO_2$. Next, by using electron beam lithography, a circular square-lattice pattern is drawn and developed. The diameter of the circle is 150 nm, and the distance between the centers of the adjacent circles is 300 nm.

Next, with the resist used as a mask, $SiO_2$ is etched by RIE by using $CF_4$ gas.

A tetragonal lattice pattern is formed on the $SiO_2$, and therefore, this time, with the $SiO_2$ used as a mask, the GaN is etched. The GaN is etched by RIE using $Cl_2$ gas, and a hole with a depth of 300 nm is formed as the first hole 102a. The $SiO_2$ is removed with hydrofluoric acid, and the substrate is set in the MOCVD apparatus again. The substrate is heated to 900° C. while 10 slm of $N_2$ and 5 slm of $NH_3$ are supplied. Next, TMG is supplied at 10 μmol/min with a substrate temperature at 900° C., and the substrate is kept for 15 minutes. In this step, the GaN is subjected to low temperature mass-transport. Since the GaN is subjected to low temperature mass-transport at a temperature (900° C.) lower than the epitaxial growth temperature, Ga transported from the surface attaches to the side wall of the hole, and the hole diameter becomes small. As a result of the heat-treatment at 900° C., the second hole 102b having a diameter of 50 nm and a depth of 270 nm is formed.

Next, supply of TMG is stopped, and while $N_2$ and $NH_3$ are supplied, the substrate temperature is increased to 1100° C., and the substrate temperature is kept for 10 minutes. Since the heat-treatment is performed at an epitaxial growth temperature, the diffusion length of the Ga atoms subjected to mass-transport becomes large, and the amount of diffusing atoms also increases. Further, the hole has a small diameter of 50 nm, and has a high aspect ratio. Therefore, the Ga atoms hardly flow to the bottom of the hole, and Ga reattaches to the hole upper portion. As a result of heat-treatment at 1100° C., the structure with the hole upper portion closed is formed. The hole upper portion is closed with GaN of a thickness of 20 nm, and a hole with a diameter of 50 nm and a depth of 250 nm is formed inside the GaN as the third hole 102c.

Example 3

In the present example, a method for producing a microstructure by using the manufacturing method shown in embodiment 3 will be described. First, as the substrate 100, a GaN substrate of a c plane is used. Next, the GaN substrate is set in the MOCVD apparatus. The GaN substrate is heated to about 1100° C., TMGa is supplied at 100 μmol/min, and 5 slm of $NH_3$ is supplied, whereby GaN is grown by 3 μm as the GaN semiconductor layer 101. Next, the substrate is taken out of the MOCVD apparatus, $SiO_2$ of a thickness of 200 nm is formed on the GaN by a plasma CVD apparatus, and a resist is coated on the $SiO_2$. Next, by using electron beam lithography, a circular square-lattice pattern is drawn and developed. The diameter of the circle is 150 nm, and the distance between the centers of the adjacent circles is 300 nm.

Next, with the resist used as a mask, $SiO_2$ is etched by RIE using $CF_4$ gas. A tetragonal lattice pattern is formed on the $SiO_2$, and therefore, this time, with the $SiO_2$ used as a mask, the GaN is etched by RIE using $Cl_2$ gas. A circular hole with a diameter of 100 nm and a hole depth of 200 nm is formed as the first hole 102a. The $SiO_2$ is removed with hydrofluoric acid, and the substrate is set in the MOCVD apparatus again. The substrate 100 is heated to 900° C. while 10 slm of $N_2$ and 5 slm of $NH_3$ are supplied. Next, TMG is supplied at 10 μmol/min with a substrate temperature at 900° C., and the substrate temperature is kept for 30 minutes. At this time, the GaN is subjected to low temperature mass-transport.

Since the GaN is subjected to low temperature mass-transport at a temperature (900° C.) lower than the epitaxial growth temperature, Ga transported from the surface attaches to the side wall of the hole, and the diameter of the hole becomes small. As a result of the heat-treatment at 900° C., the hole having a diameter of 50 nm and a depth of 190 nm is formed as the second hole 102b. Next, supply of TMG is stopped, and while $N_2$ and $NH_3$ are supplied, the substrate temperature is increased to 1100° C. When the temperature of the substrate reaches 1100° C., TMG is supplied at 100 μmol/min, and the GaN is regrown as the second GaN semiconductor layer 103. The hole has a small diameter of 50 nm, and has a high aspect ratio. Therefore, the raw material hardly flows into the bottom of the hole, and therefore, GaN is regrown while retaining the hole shape.

Example 4

In the present example, the method for producing a two-dimensional photonic crystal surface-emitting laser configured by arrangement of a plurality of the above described holes by using the manufacturing method shown in embodiment 2 will be described with use of FIGS. 6A to 6F. FIGS. 6A to 6F illustrate an n-GaN substrate 600, an n-GaN 601, an n-$Al_{0.10}Ga_{0.90}$N 602, an n-GaN 603, and an $In_{0.10}Ga_{0.90}$N/GaN multiquantum well active layer 604. FIGS. 6A to 6F also illustrate a p-$Al_{0.15}Ga_{0.85}$N layer 605, a p-GaN 606, an $SiO_2$ 607, a photonic crystal 608, an p-$Al_{0.10}Ga_{0.90}$N 609, a p-GaN layer 610, an Ni/Au electrode 611, and an Ti/Al a electrode 612.

In the method of the present example, first, the n-GaN substrate 600 of a c plane is prepared as the substrate 100. Next, the n-GaN substrate 600 is set in the MOCVD apparatus. The following layers are sequentially grown on the n-GaN substrate 600. More specifically, the n-GaN layer 601 of a thickness of 3 μm, the n-$Al_{0.10}Ga_{0.90}$N layer 602 of 500 nm, and the n-GaN layer 603 of 50 nm are grown. Further, on the n-GaN layer 603, the $In_{0.10}Ga_{0.90}$N/GaN multiquantum well active layer 604, and the p-$Al_{0.15}Ga_{0.85}$N layer 605 of 20 nm are grown.

Figure 6A:
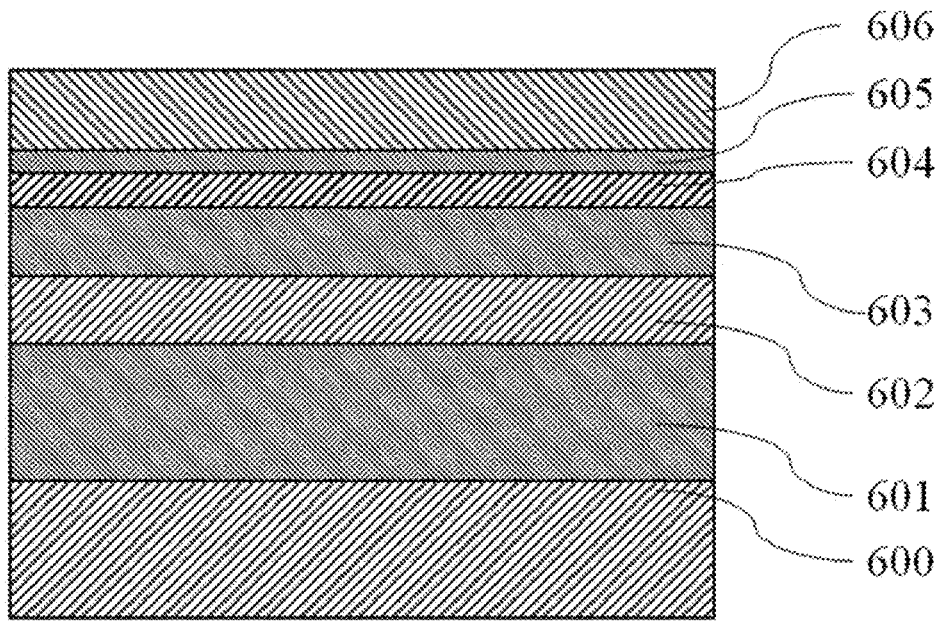
FIG. 6A is a view illustrating a production process of a surface-emitting laser including a photonic crystal according to example 4 of the present invention.
Figure 6B:
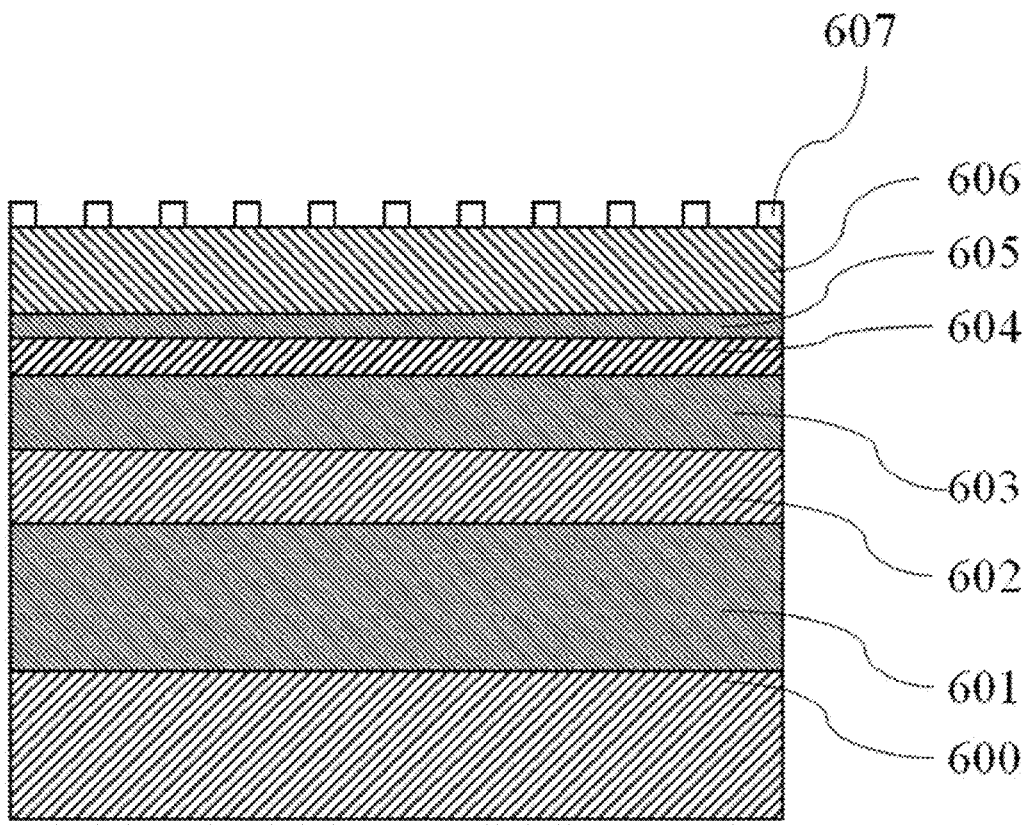
FIG. 6B is a view illustrating the production process of the surface-emitting laser including the photonic crystal according to example 4 of the present invention.
Figure 6C:
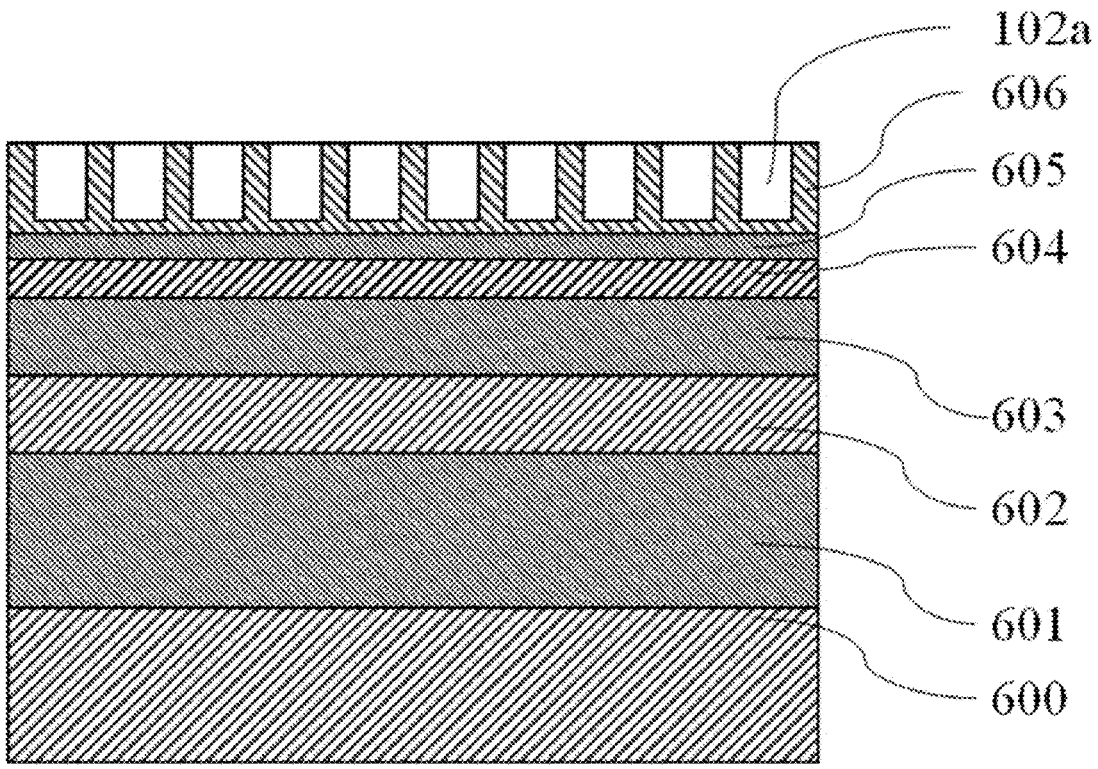
FIG. 6C is a view illustrating the production process of the surface-emitting laser including the photonic crystal according to example 4 of the present invention.

Next, as the first GaN semiconductor layer 101, the p-GaN 606 of a thickness of 250 nm is grown on the p-$Al_{0.15}Ga_{0.85}$N layer 605 (FIG. 6A). Next, the substrate is taken out of the MOCVD apparatus, and the $SiO_2$ 607 is formed on the p-GaN 606, and is coated with a resist. By electron beam lithography, a pattern of a tetragonal lattice with circles each with a diameter of 100 nm and the distance between the centers of the circles of 160 nm is drawn and developed. The $SiO_2$ 607 is etched by RIE using $CF_4$ with a resist used as a mask (FIG. 6B). Thereafter, the p-GaN 606 is etched to a depth of 240 nm by ICP using $Cl_2$ with the $SiO_2$ 607 as a mask, and thereby, the first hole 102a is formed. After the p-GaN 606 is etched, the $SiO_2$ 607 is removed by hydrofluoric acid (FIG. 6C).

Figure 6D:
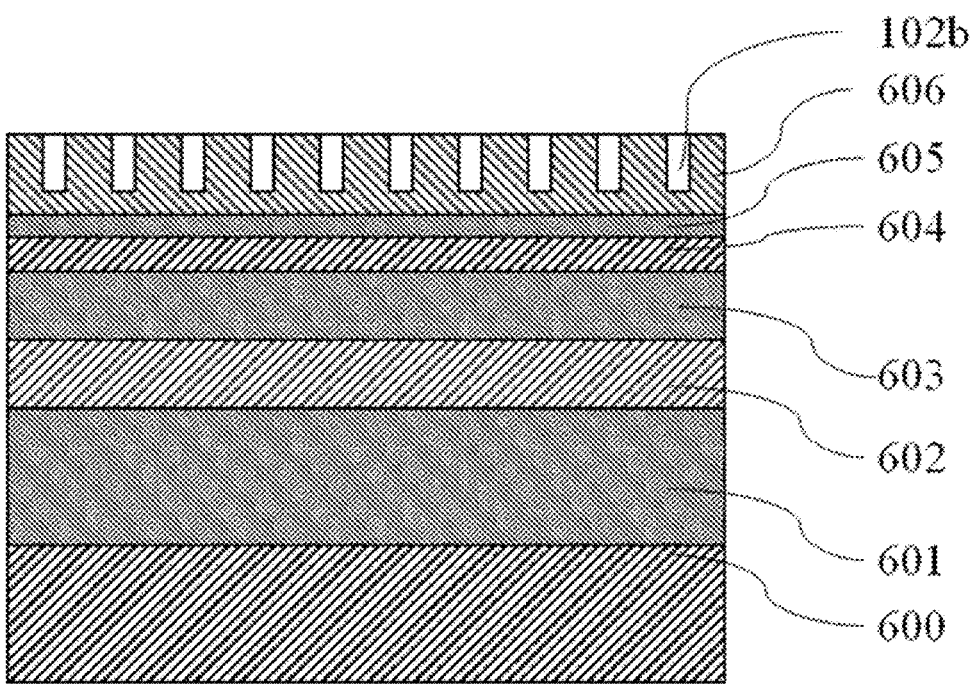
FIG. 6D is a view illustrating the production process of the surface-emitting laser including the photonic crystal according to example 4 of the present invention.
Figure 6E:
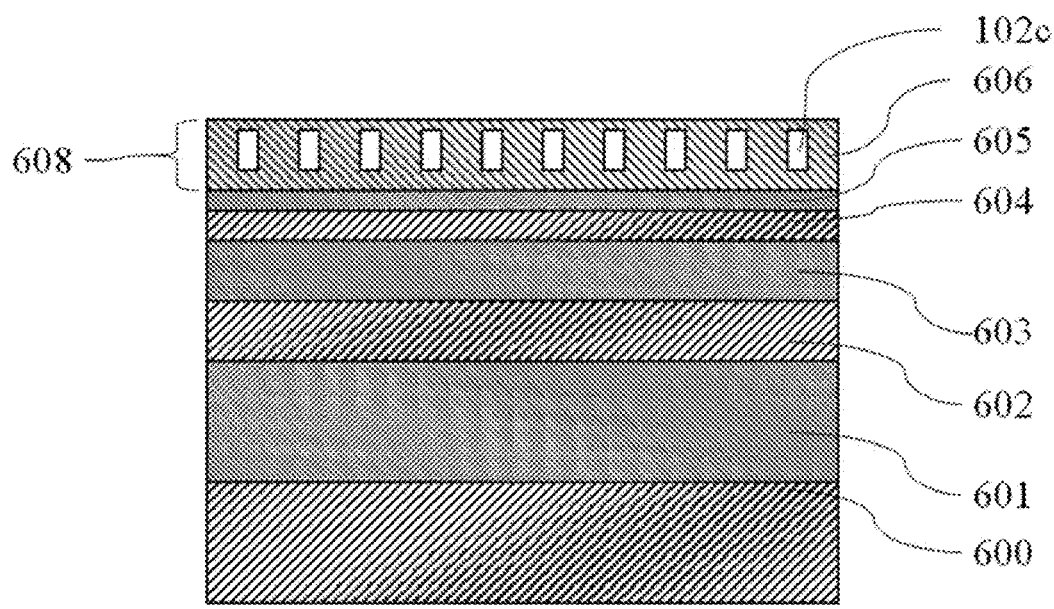
FIG. 6E is a view illustrating the production process of the surface-emitting laser including the photonic crystal according to example 4 of the present invention.

The substrate is set in the MOCVD apparatus again, and the substrate is heated to 900° C. while 10 slm of $N_2$ and slm of $NH_3$ are supplied. When the substrate temperature reaches 900° C., the substrate temperature is kept for 30 minutes, and the first hole 102a is made narrow by low temperature mass-transport. By the heat-treatment at 900° C., the second hole 102b with a diameter of 60 nm and a depth of 230 nm is formed (FIG. 6D). Next, while $N_2$ and $NH_3$ are supplied, the substrate temperature is increased to 1025° C., and after the substrate temperature reaches 1025° C., the substrate temperature is kept for 10 minutes. In this step, the first hole 102b is closed by the p-GaN 606 by mass-transport, the upper portion of the second hole 102b is closed by 20 nm, and the third hole 102c is formed. The two-dimensional photonic crystal 608 which is configured by the third hole 102c and the p-GaN 606 is formed inside the p-GaN 606 layer (FIG. 6E). In the present example, the photonic crystal 608 is formed on the upper portion of the $In_{0.10}Ga_{0.90}$N/GaN multiquantum well active layer 604, but may be formed at the lower portion of the $In_{0.10}Ga_{0.90}$N/GaN multiquantum well active layer 604. Further, the photonic crystal 608 may be formed on the $In_{0.10}Ga_{0.90}$N/GaN multiquantum well active layer 604.

Figure 6F:
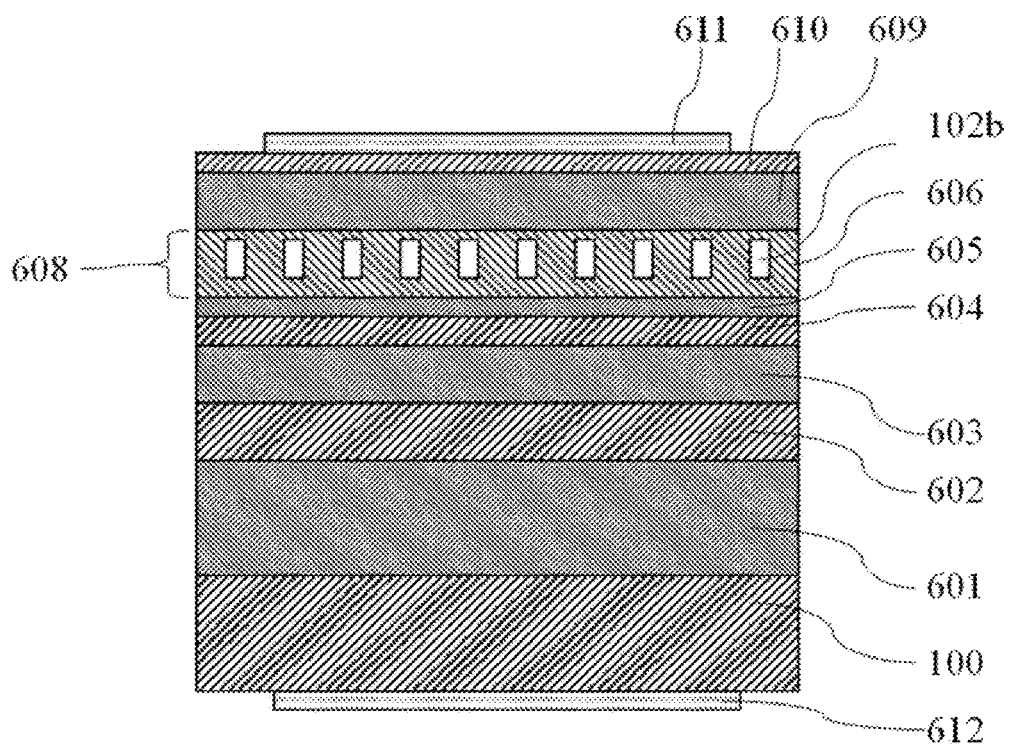
FIG. 6F is a view illustrating the production process of the surface-emitting laser including the photonic crystal according to example 4 of the present invention.

Next, the p-$Al_{0.10}Ga_{0.90}$N 609 layer of a thickness of 500 nm is formed on the p-GaN layer 606, and finally, the p-GaN layer 610 for electrode formation is grown on the p-$Al_{0.10}Ga_{0.90}$N layer 609 by 50 nm. The substrate is taken out of the MOCVD device, the Ni/Au electrode 611 is formed on the p-GaN layer 610 for electrode formation with a vapor deposition apparatus, and the Ti/Al a electrode 612 is formed on the back surface of the n-GaN substrate, whereby the surface-emitting laser including the photonic crystal of a 2D periodic structure is completed (FIG. 6F). In the above described example, the surface-emitting laser including the two-dimensional photonic crystal is described, but the present invention also can be applied to production of a DFB laser configured by a plurality of the above described holes being arranged one-dimensionally.

Experimental Example 1

Figure 7A:
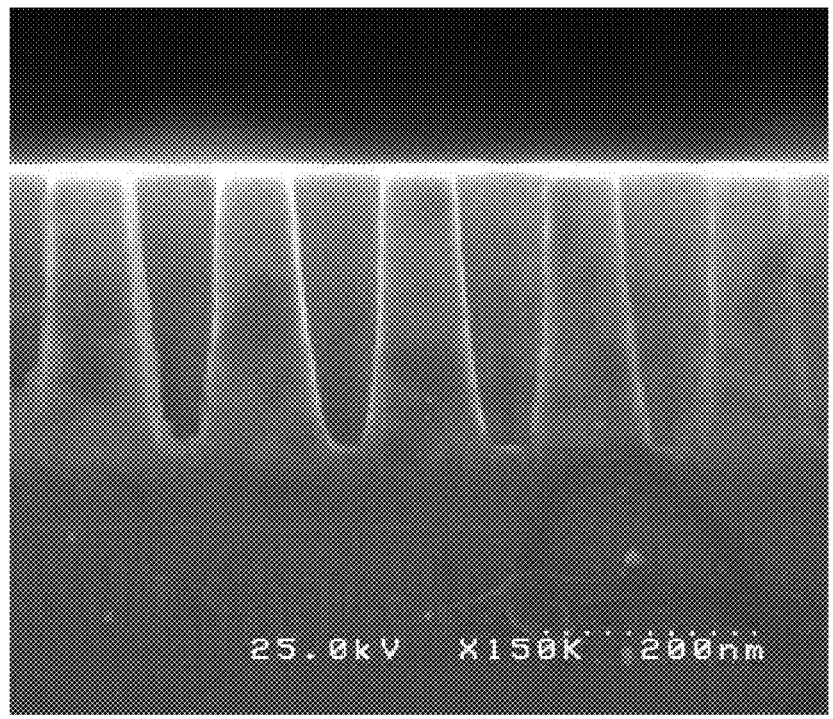
FIG. 7A is an electron micrograph illustrating a shape before heat-treatment of a specimen used in experimental examples 1 and 2 of the present invention.
Figure 8A:
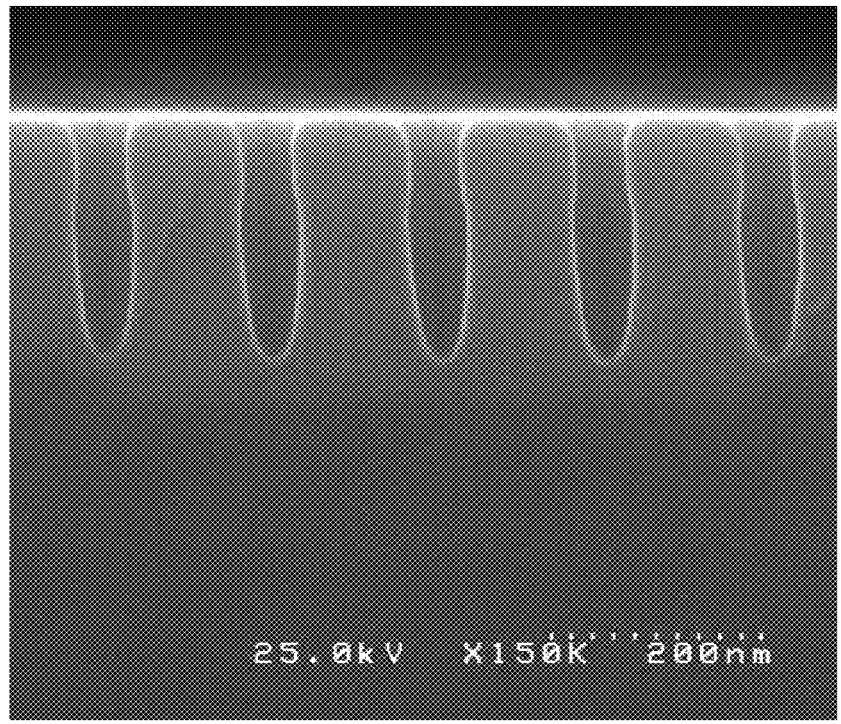
FIG. 8A is an electron micrograph showing the shape of a hole when a heat-treatment temperature of a third step is changed, in experimental example 1 of the present invention.
Figure 8B:
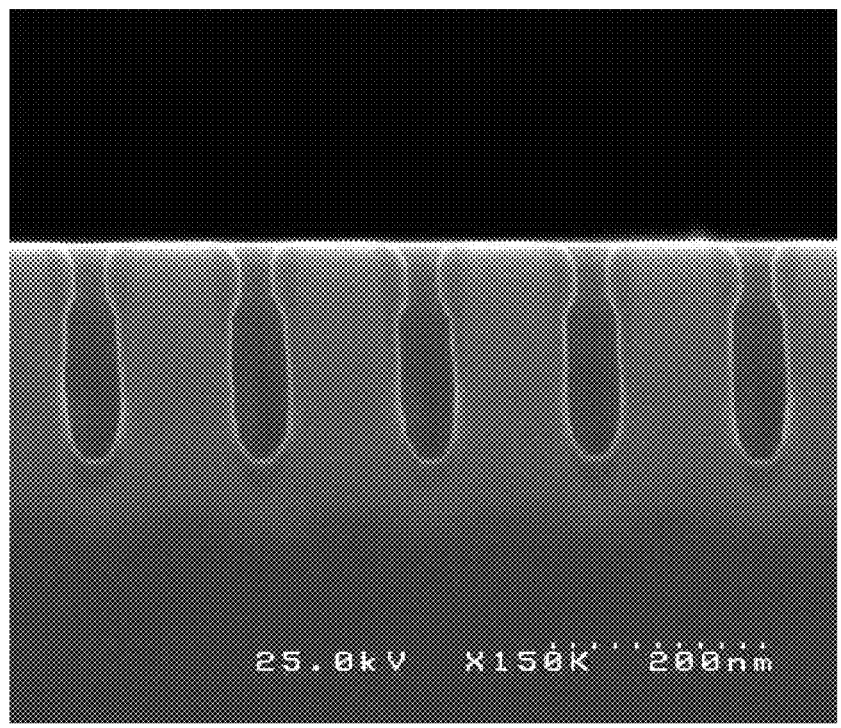
FIG. 8B is an electron micrograph showing the shape of the hole when the heat-treatment temperature of the third step is changed, in experimental example 1 of the present invention.
Figure 8C:
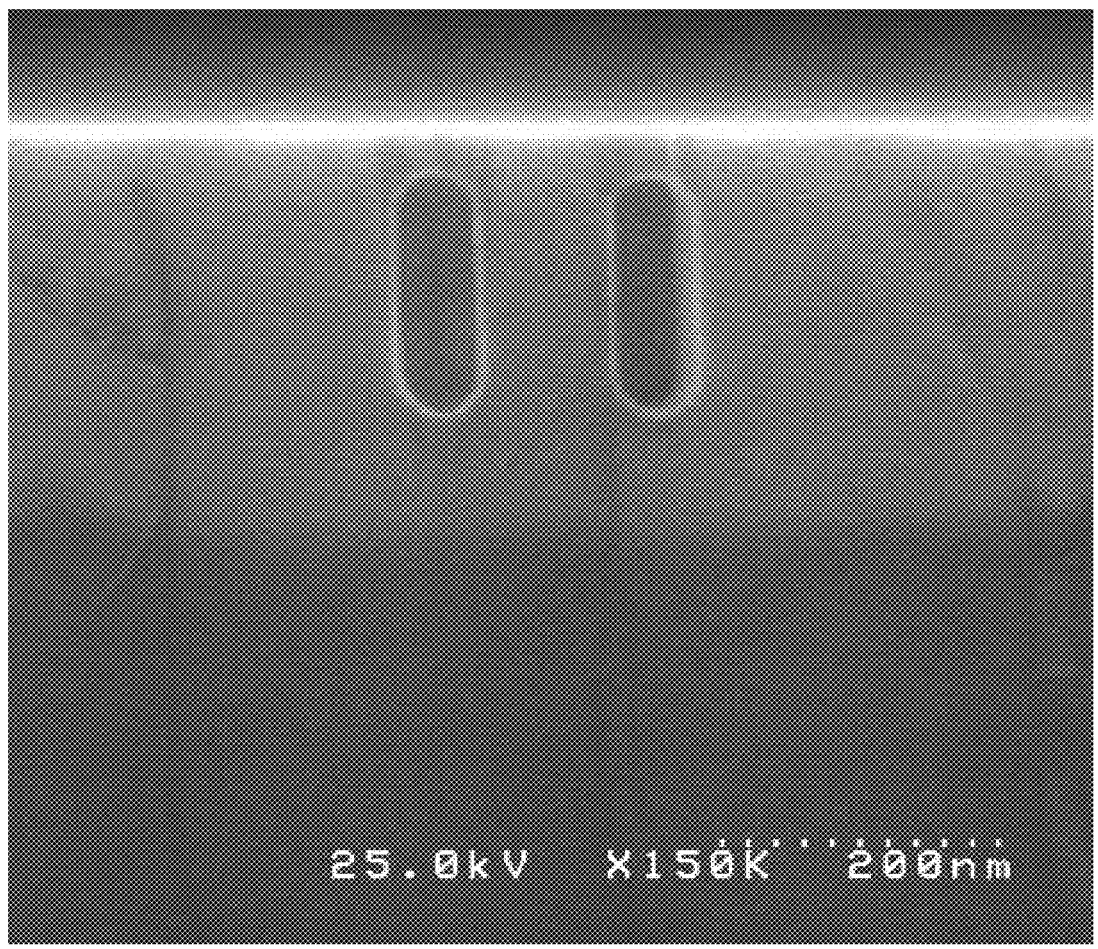
FIG. 8C is an electron micrograph showing the shape of the hole when the heat-treatment temperature of the third step is changed, in experimental example 1 of the present invention.

The present experimental example is the result of investigating the upper limit of the heat-treatment temperature of the step of making the hole narrow, in the third step shown in embodiment 1. By using an MOCVD apparatus, GaN was grown on a sapphire substrate. Next, p-GaN is grown on the GaN as the semiconductor 101. Subsequently, the first hole 102a was produced in the p-GaN. FIG. 7A is an electron micrograph in which a section of the first hole 102a produced on the p-GaN is observed. The hole has a diameter of the hole upper portion of about 90 nm, a diameter of the hole bottom portion of 40 nm and a depth of 240 nm. The shape of the hole becomes narrower toward the bottom from the upper portion. The heat-treatment of the third step is carried out at temperatures of 900° C., 950° C. and 1025° C. with retention time of 0 minutes (only the rising and lowering temperature), and the shape of the hole after the heat-treatment was observed with an electron microscope. FIGS. 8A, 8B and 8C are electron micrographs of the specimens which were subjected to heat-treatment at 900° C., 950° C. and 1025° C., respectively.

At the heat-treatment temperature of 900° C., a desired structure was obtained with the diameter of about 60 nm. At the heat-treatment temperature of 950° C., the diameter became about 50 nm. At the heat-treatment temperature of 1025° C. the diameter became about 50 nm, but the upper portion of the hole was completely closed. When attention is paid to the upper portion of the hole, as the heat-treatment temperature becomes higher to 900° C. and 950° C., the hole diameter becomes narrower to be about 45 nm and about 25 nm, and the upper portion is completely closed at 1025° C. When the heat-treatment temperature is too high, the amount of atoms subjected to mass-transport is large, and the diffusion length becomes long. Therefore, atoms easily reattach to the hole upper portion, and the hole upper portion becomes narrow, or the hole upper portion is closed, whereby a cavity is formed. If the hole upper portion is closed, and a cavity is formed, supply of atoms to the inside of the hole from the surface of the semiconductor layer stops. As a result, the diameter of the hole cannot be controlled to be narrower by the retention time of the heat-treatment and the supply amount of a group III. From the above, the heat-treatment temperature can be set at 950° C. or lower.

Experimental Example 2

Figure 7B:
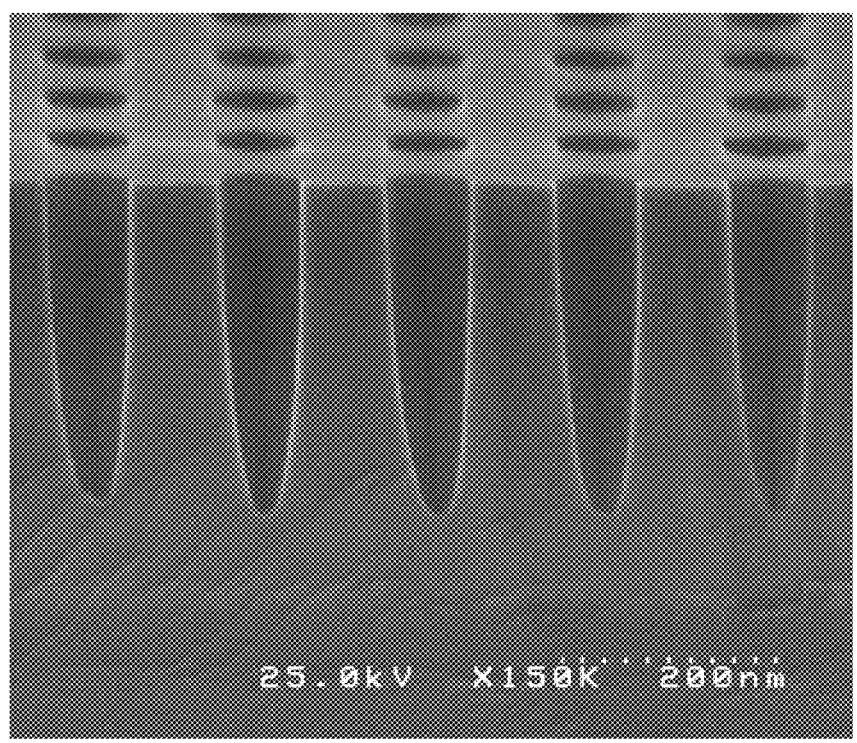
FIG. 7B is an electron micrograph illustrating the shape before heat-treatment of a specimen used in experimental examples 1 and 2 of the present invention.
Figure 9A:
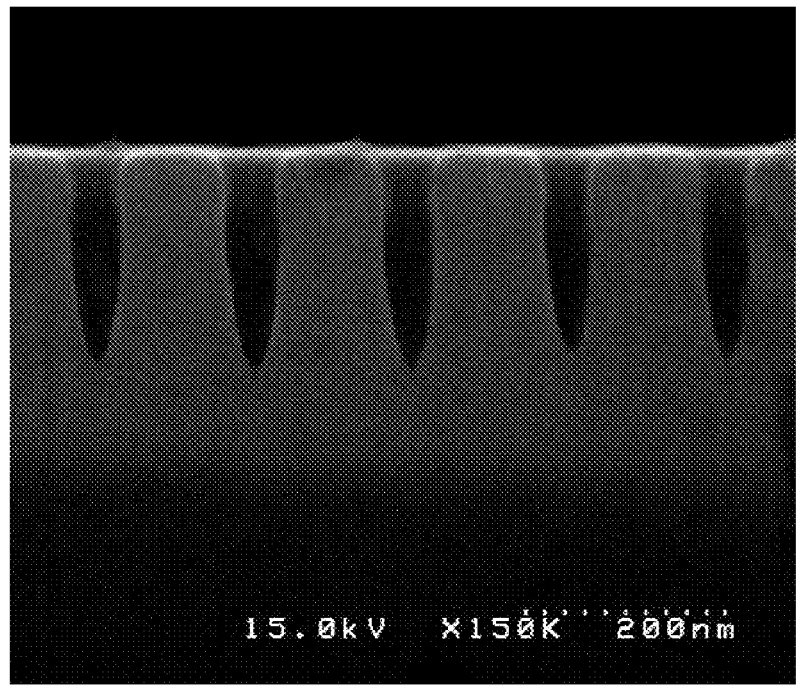
FIG. 9A is an electron micrograph showing the shape of a hole when the heat-treatment temperature of the third step was changed, and heat-treatment was performed for 30 minutes, in experimental example 2 of the present invention.
Figure 9B:
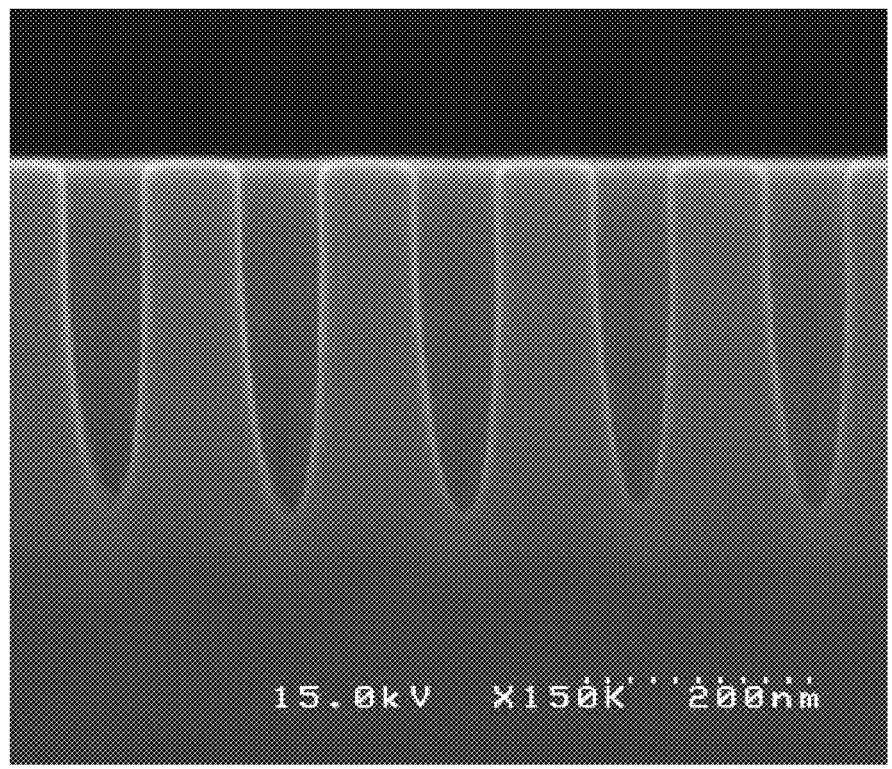
FIG. 9B is an electron micrograph showing the shape of the hole when the heat-treatment temperature of the third step was changed, and heat-treatment was performed for 30 minutes, in experimental example 2 of the present invention.

The present experimental example is the result of investigating the lower limit of the heat-treatment temperature of the step of making the hole narrow in the third step shown in embodiment 1. By the similar procedures to that of experimental example 1, the heat-treatment temperature of the third step was changed, the heat-treatment was carried out for 30 minutes, and the shape of the hole was observed with an electron microscope. FIGS. 9A and 9B are sectional photographs after the heat-treatment. FIG. 9A is the result of the heat-treatment temperature of 850° C. and the hole depth of 240 nm, whereas FIG. 9B is the experimental result of the heat-treatment temperature of 800° C. and the hole depth of 340 nm. Since the hole depths differ between two specimens, the electron micrographs observing the sectional shapes of the respective specimens before the heat-treatment are illustrated in FIGS. 7A and 7B for comparison. When FIGS. 7A and 9A are compared, it can be confirmed that the corner of the hole upper portion is rounded and the diameter is small in FIG. 9A in which heat-treatment is performed at a temperature of 850° C. Here, the shape of the hole of FIG. 9A looks like the shape of the hole of FIG. 8A of experimental example 1. From this, it can be said that when the heat-treatment temperature of 900° C. for a time of 0 minutes of FIG. 8A and that of 850° C. for a time of 30 minutes of FIG. 9A are compared, the amount of atoms moving by mass-transport becomes small at the heat-treatment temperature of 850° C., but by increase of the heat-treatment time, the diameter of the hole can be made narrow. Meanwhile, when FIGS. 7B and 9B are compared, in FIG. 9B in which heat-treatment was carried out at a temperature of 800° C., the hole upper corners are only slightly rounded. This is because when the heat-treatment temperature is made lower than 800° C., sufficient thermal energy is not obtained, and the amount of diffusing atoms significantly decreases. Accordingly, the heat-treatment temperature can be 850° C. or higher.

Experimental Example 3

Figure 10:
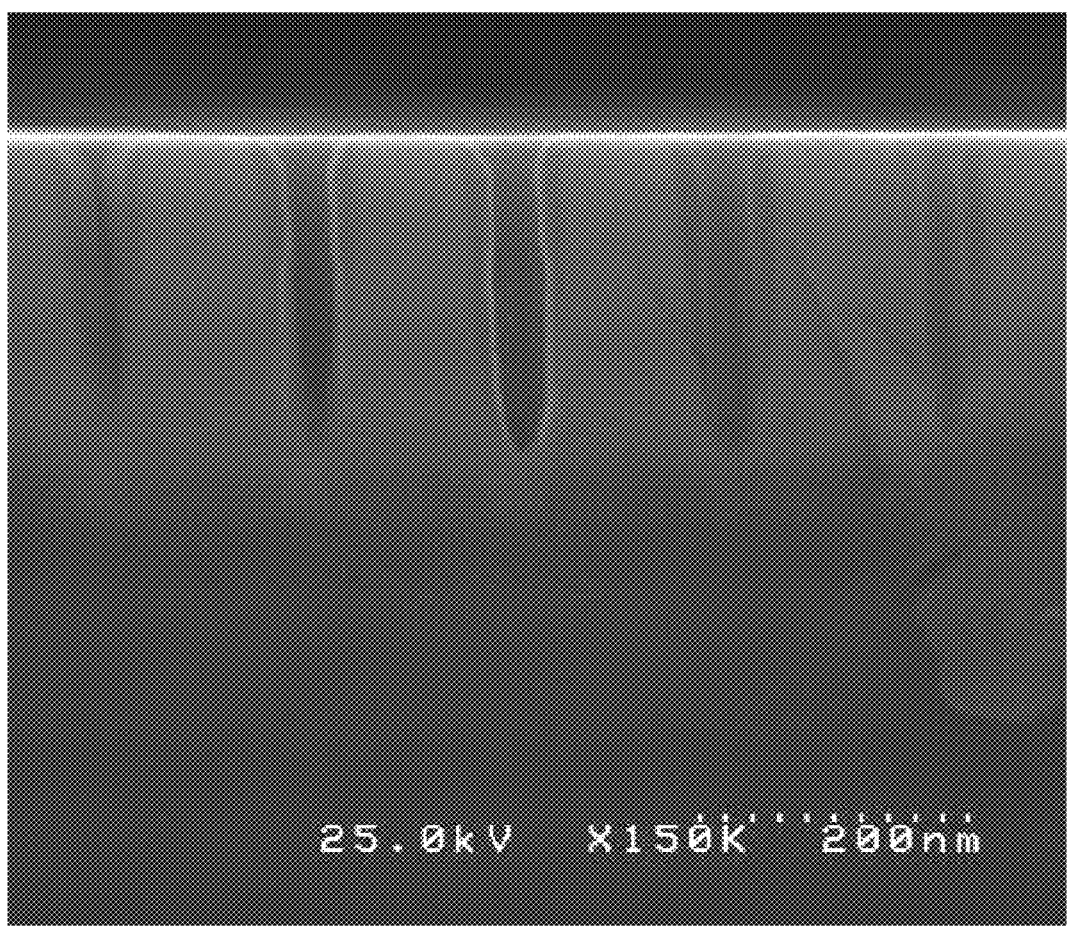
FIG. 10 is an electron micrograph showing the shape of a hole when the heat-treatment of the third step was carried out with retention time of a temperature of 900° C. being 30 minutes, in experimental example 3 of the present invention.

The present experimental example is the result of investigating the influence given by the heat-treatment time of the third step shown in embodiment 1. The hole of the same structure as in experimental example 1 was produced, and heat-treatment was carried out at a temperature of 900° C. with a retention time of 30 minutes. FIG. 10 is an electron micrograph of the hole of the specimen subjected to heat-treatment at 900° C. for 30 minutes. When the diameter of the hole of FIG. 10 is compared with that of FIG. 7B which is the result of the heat-treatment temperature of 900° C. with a retention time of 0 minutes of experimental example 1, it is found that the hole becomes narrower as a result of making the retention time long. The diameter of the hole was about 60 nm when the retention time was 0 minutes, but as a result that the retention time was made 30 minutes, the diameter of the hole became narrower to be about 40 nm. Further, the depth of the hole 102b did not change and was 240 nm in both the cases of the retention times of 0 minutes and 30 minutes. The present experimental result clearly shows that the hole diameter can be controlled by the heat-treatment time while the depth of the hole is kept constant.

The results of the above described experimental examples 1, 2 and 3 are organized in Table 1. Here, the case is represented by A, where narrow holes were obtained, and the upper portions of the holes were not closed. The case is represented by B, where the hole upper portions were narrow, and were almost partially closed. The case is represented by C, where the holes were completely closed, or did not change.

TABLE 1

|  |  | TEMPERATURE (° C.) | | | | |
| --- | --- | --- | --- | --- | --- | --- |
|  |  | 800 | 850 | 900 | 950 | 1025 |
| TIME (MINUTE) | 0 | — | — | A | B | C |
|  | 30 | C | A | A | — | — |

From the above experimental results, in order to make the hole narrow with low temperature mass-transport, the heat-treatment temperature can be 850° C. or higher, and 950° C. or lower. Further, the diameter of the hole can be controlled by proper control of the heat-treatment temperature and heat-treatment time. For example, when the heat-treatment temperature is 850° C., the heat-treatment time is made long, and thereby, the effect of the present invention is provided. Further, from these results, it can be predicted that when the heat-treatment temperature is 950° C., if the heat-treatment time is made too long, the hole upper portion is closed. Therefore, heat-treatment for a short time can be adopted at 950° C. Therefore, when the heat-treatment time is made short, the heat-treatment temperature can be set at a temperature from 875° C. to 950° C. inclusive, or from 875° C. to 925° C. inclusive.

Further, when the heat-treatment time is made long, the heat-treatment temperature can be set at a temperature from 850° C. to 900° C. inclusive.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-178401, filed Jul. 30, 2009, which is hereby incorporated by reference herein in its entirety.

What is claimed is:

1. A manufacturing method of a microstructure for forming a microscopic structure in a semiconductor, comprising:
    a first step of forming a first GaN semiconductor layer on a substrate;
    a second step of forming a first hole by using etching on the first GaN semiconductor layer formed in the first step; and
    a third step of performing heat-treatment at a temperature from 850° C. to 950° C. inclusive under a gas atmosphere including nitrogen, in order to form a second hole in which a diameter of the first hole formed in the second step is made narrower than the diameter of the first hole in an in-plane direction of the substrate.

2. The manufacturing method of a microstructure according to claim 1, wherein a temperature of the heat-treatment in the third step is from 850° C. to 900° C. inclusive.

3. The manufacturing method of a microstructure according to claim 2, wherein in the heat-treatment of the third step, a group III raw material is supplied on a condition that a III/N (nitrogen) ratio that is a mole ratio is lower than a III/N ratio of the first step.

4. The manufacturing method of a microstructure according to claim 1, further comprising:
    a fourth step for performing heat-treatment after the third step, wherein in a gas atmosphere including a nitrogen source, heat-treatment is performed at a temperature higher than the temperature of the heat-treatment in the third step, and an upper portion of the second hole is closed with a first GaN semiconductor.

5. The manufacturing method of a microstructure according to claim 4, wherein the temperature of the heat-treatment in the fourth step is 1000° C. or higher.

6. The manufacturing method of a microstructure according to claim 4, wherein in the heat-treatment of the fourth step, a second GaN semiconductor layer is grown on the first GaN semiconductor layer by supply of a group III raw material to close an upper portion of the second hole.

7. The manufacturing method of a microstructure according to claim 1, wherein an aspect ratio of the hole is 1 or more.

8. The manufacturing method of a microstructure according to claim 1, wherein a diameter of the hole is 1 μm or less.

9. A manufacturing method of a microstructure, wherein the manufacturing method of a microstructure according to claim 1 is a production method used at a time of production of a plurality of arranged holes which configure a photonic crystal or a 2D periodic structure.

10. The manufacturing method of a microstructure according to claim 9, wherein the photonic crystal or 2D periodic structure is a photonic crystal or a 2D periodic structure which configures a surface-emitting laser.

* * * * *